United States Patent [19]

Shintaku et al.

[11] Patent Number: 5,055,785
[45] Date of Patent: Oct. 8, 1991

[54] SUPERCONDUCTIVE MAGNETO RESISTIVE APPARATUS FOR MEASURING WEAK MAGNETIC FIELD USING SUPERCONDUCTIVE MAGNETO-RESISTIVE ELEMENT

[75] Inventors: Hidetaka Shintaku; Shuhei Tsuchimoto; Nobuo Hashizume, all of Nara; Shoei Kataoka, Tanashi, all of Japan

[73] Assignee: Sharp Kabushiki Kaisha, Osaka, Japan

[21] Appl. No.: 374,880

[22] Filed: Jul. 3, 1989

[30] Foreign Application Priority Data

Jul. 4, 1988 [JP] Japan ................. 63-167593

[51] Int. Cl.$^5$ ............... G01R 33/035; G01R 33/06
[52] U.S. Cl. ........................... 324/248; 324/252; 505/701; 505/845
[58] Field of Search ............... 324/248, 252; 505/701–705, 843, 845, 846

[56] References Cited

U.S. PATENT DOCUMENTS

| | | | |
|---|---|---|---|
| 4,052,748 | 10/1977 | Kuijk | 324/252 X |
| 4,142,218 | 2/1979 | Gorter | 324/252 X |
| 4,535,375 | 8/1985 | Mowry et al. | 324/252 X |
| 4,566,050 | 1/1986 | Beam et al. | 324/252 X |
| 4,875,010 | 10/1989 | Yokosawa et al. | 324/248 |

FOREIGN PATENT DOCUMENTS 0251023 6/1987 European Pat. Off. .

OTHER PUBLICATIONS

Novel Magnetic Sensor Using Y—Ba—Cu—O Ceramic Superconductor: Super Magneto-Resistor—Shuhei Tsuchimoto, Shoei Kataoka, Hideo Nojima Ryusuke Kita, Masaya Nagata and Hidetaka Shintaku—International Electron Devices Meeting, Washington, DC, Dec. 6-9, 1987.

"Superconductive Electronics" ISBN 4-274-03095-4, Printed in Japan, pp. 47-87, Dec. 1985.

Nojima et al., "Galvanomagnetic Effect of an Y—Ba—Cu—O Ceramic Superconductor and Its Application to Magnetic Sensors", *Japanese Journal of Applied Physics*, vol. 27, No. 5, May 1988, pp. 746-750.

*Primary Examiner*—Kenneth A. Wieder
*Assistant Examiner*—Warren S. Edmonds

[57] ABSTRACT

A ceramic superconductive magneto-resistive element which has weak grain boundaries is highly sensitive to weak magnetic fields. The magnetic field is measured by the use of an electronic circuit. A comparator is used for comparing an output and reference voltage of the element. When there is a difference between the output and reference voltage bias current is used to equalize these voltages.

4 Claims, 4 Drawing Sheets

SUPERCONDUCTIVE MAGNETO RESISTIVE APPARATUS FOR MEASURING WEAK MAGNETIC FIELD USING SUPERCONDUCTIVE MAGNETO-RESISTIVE ELEMENT

BACKGROUND OF THE INVENTION

1. Field of the Invention

The present invention relates to an apparatus for measuring a magnetic field by means of a superconductive magneto-resistive element which can detect a weak magnetic field by utilizing the magneto-resistive effect of a ceramic superconductor.

2. Description of the Prior Art

Before the description proceeds, it is noted that the word "resistance" means "electric resistance" and "magneto-resistive element" means "the element of which electric resistance of the element is changed corresponding to the magnetic field applied to the element".

Conventionally, semiconductors, magnetic materials or other devices with magneto-resistive effects have been utilized for detecting or measuring a magnetism. A magneto-resistive element such as a ferromagnetic metal, Fe-Ni (Permalloy) or Co-Ni shows resistance increase along a quadratic curve with respect to the strength of an applied magnetic field, so that a bridge circuit is ordinarily used for detecting the magnetic field.

Furthermore, such a magnetic sensor is being developed that can detect a weak magnetic field by utilizing the magneto-resistive effect of a ceramic superconductor in which the grain boundaries are weakly joined to one another.

The conventional magneto-resistive element using a magnetic material or the like is small in resistance variation, particularly, with respect to near zero magnetic field. Accordingly, a bias magnetic field by a permanent magnet or an electromagnet is applied to this element to use a large variation in resistance with respect to variation in the magnetic field strength for measurement. However, such a device has suffered poor measuring accuracy and sensitivity.

Furthermore, there is another type of magneto-resistive element using a newly-developed ceramic superconductor in which the grain boundaries are weakly joined, for enabling to measure even a weak magnetic field. FIG. 1 shows one of the characteristics of the superconductive magneto-resistive element. FIG. 1 is a graph in which the axis of abscissa represents a magnetic field strength H when a constant current I is fed to the magneto-resistive element, to which a magnetic field is applied; and the axis of ordinate represents voltage V developed in the magneto-resistive element by the above mentioned current and magnetic field. As apparent from the graph, a superconductive state of the superconductive magneto-resistive element is collapsed by application of a weak magnetic field, and it abruptly shows an electrical resistance. After that, as the magnetic field strength is increased, the resistance of the element is radically increased. In addition, the larger the current fed to the element becomes, the smaller a critical magnetic field Hc inducing resistance becomes, while the larger the resistance increase to the magnetic field becomes.

As mentioned above, the magnetic sensor using a ceramic superconductor can detect and measure a weak magnetic field, however has a problem that it is difficult to adjust current to a value at which the magnetic sensor can have characteristics suitable for an applied magnetic field. Furthermore, the magnetic sensor using a permanent magnet or electromagnet for enhancing the sensitivity has a problem that it is difficult to adjust a bias magnetic field to an optimum value.

SUMMARY OF THE INVENTION

The present invention has been developed to overcome the above mentioned inefficiency of the conventional magnetic sensors, and the object thereof is to provide a magnetism measuring apparatus which can detect and measure a weak magnetic field by using a ceramic superconductor, and can automatically set optimum conditions suitable for such detection and measurement.

To accomplish the object above mentioned, the apparatus according to the present invention is characterized in that the ceramic superconductive magneto-resistive element comprises a pair of current electrodes and a pair of voltage electrodes, controls the current fed through the current electrodes so that voltage developed across the voltage electrodes can be constant, and the applied magnetic field can be calculated based on the current value.

Alike the above mentioned example, FIG. 1 shows the relationship of an applied magnetic field strength, feeding current values, and voltage developed.

As apparent from FIG. 1, when a predetermined magnetic field is applied to the ceramic superconductive magneto-resistive device, and when the voltage developed in the voltage electrodes by current fed to the current electrodes exceeds a predetermined value, the current value is decreased, thereby lowering the voltage of the voltage electrodes to the predetermined value. When voltage is not developed in the voltage electrodes by current fed to the current electrodes, or when the developed voltage is low, the current value is increased to elevate voltage to the predetermined value.

The current value controlled as mentioned above corresponds to a magnetic field strength to be measured, and hence, the magnetic field strength can be calculated by measuring the current value.

According to the present invention, the current fed to the ceramic superconductive magneto-resistive device is controlled, thereby keeping a developed voltage to a predetermined value, and hence, a magnetic field strength can be measured based on the current value. Voltage developed in the voltage electrode is significantly varied by the current variation. Accordingly, the voltage value is set to a small value close to zero, so that the current value can be controlled accurately. Therefore, if an applied magnetic field strength is calculated based on the accurately controlled current, can be provided an ideal magnetic field measuring apparatus in which the ceramic superconductive magneto-resistive device is under the conditions most suitable for detecting and measuring an applied magnetic field.

DETAILED DESCRIPTION OF THE PREFERRED EMBODIMENTS

A preferred embodiment according to the present invention will be described in detail with reference to the accompanying drawings.

In this embodiment, a superconductor is employed as the ceramic superconductive magneto-resistive element. The grain boundaries of the superconductor are so formed that the adjacent particles are joined through an extremely thin insulating film or normal electric conducting film, or they are weakly joined by point. In this condition, the superconductive state of the superconductor can be easily collapsed to the normal condition by applying a magnetic field.

The superconductor used is of $Ba_2Y_1Cu_2O_x$ type known as a high temperature superconductor. It is produced as follows: $BaCO_2$ powder, $Y_2O_3$ powder, and $CuO$ powder are weighed at predetermined values, sufficiently mixed in a mortar, and provisionally calcined at a temperature of 900° C. for 5 hours in the air; the baked mixture is repulverized to obtain powder (a particle diameter of 1 $\mu m\phi$ or less), which is then pressed under a pressure of 1 ton/cm$^2$ into circular pellets; and the circular pellets are heated at a temperature of 1,000° C. for 3 hours in the air, and slow-cooled to a temperature of 200° C. in 5 hours to obtain the above mentioned superconductors.

It is confirmed that the produced ceramic superconductor, shows a mono phase of a rhombic system on the X-ray diffraction observation.

Superconductor materials can be produced not only by the calcining method using powder materials, but by the sputtering or CVD process in which the calcining conditions of a filmy superconductor are controlled.

Figure 3:
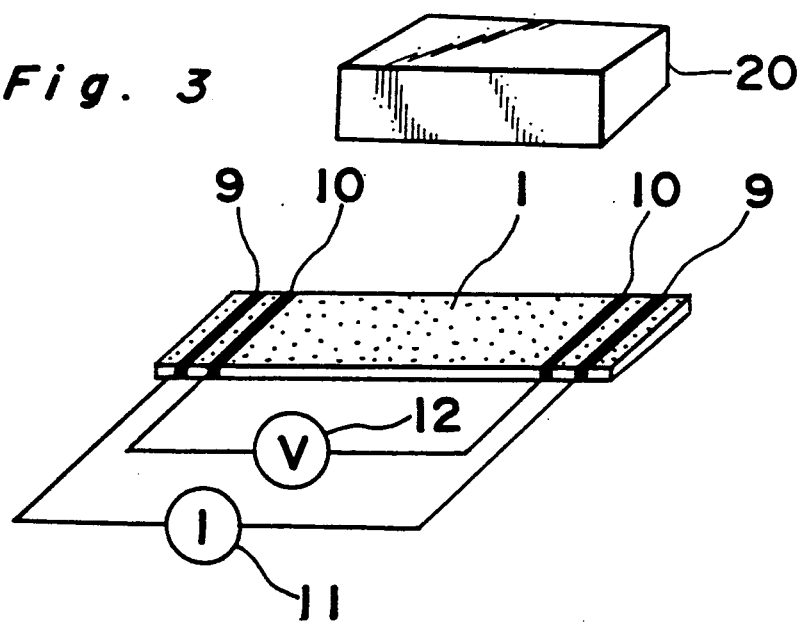
FIG. 3 is a schematic view for illustrating the essential portion of the present invention.

The produced superconductor is cut into rectangular chips (1 mm wide×7 mm long×0.7 mm thick) as shown by a numeral 1 in FIG. 3. A pair of current electrodes 9 are provided at the respective areas near to the both ends thereof for feeding electric current, and a pair of voltage electrodes 10 are respectively provided at positions on the superconductor 1 inwardly relative to the current electrodes for detecting voltage developed therein. These electrodes are made by deposition Ti metal which shows an excellent electrical connection to ceramics or the like. Lead wires are connected to the respective current electrodes 9 and voltage electrodes 10 made of Ti by Ag paste, and the respective lead wires are connected to a constant current source 11, and a voltage indicator 12 respectively.

The ceramic superconductor 1 is kept at a liquid nitrogen temperature (77K) bellow its critical temperature Tc, and voltage developed across the voltage electrodes 10 is measured by the voltage indicator 12 so as to control the current from the constant current source 11 through the current electrodes 9.

Figure 2:
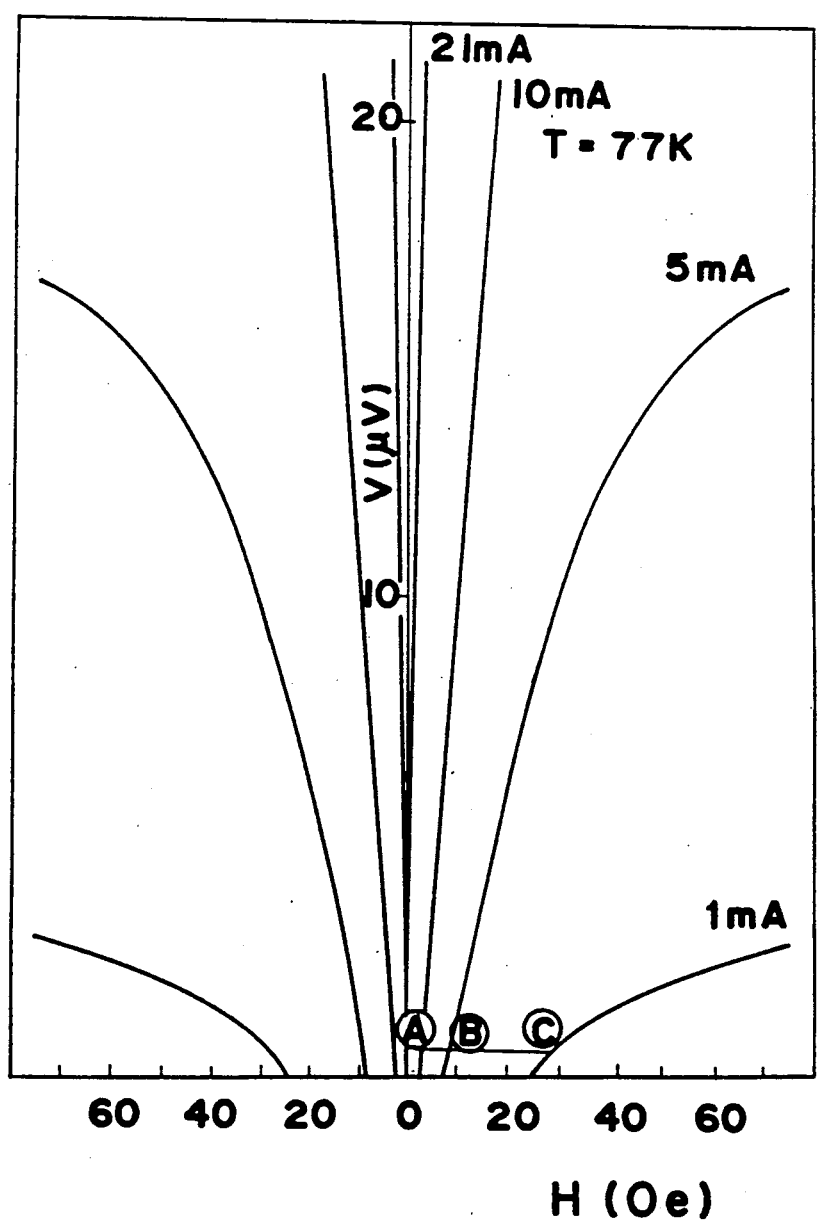
FIG. 2 is a graph for showing the characteristics of the magneto-resistive element to describe the operation of the present invention.

Under the above mentioned conditions, when any magnetic field is not applied to the superconductor 1, any voltage is not developed unless a current of several tens mA is fed to the superconductor 1, however, the superconductor has a feature that even when a current of several mA is fed thereto, voltage is abruptly generated with the application of a relatively weak magnetic field of several tens oersted, and is rapidly increased as shown in FIG. 2.

A superconductor is different from the conventional semiconductor and magnetic material in that the magneto-resistive effect of the superconductor shows a radical variation in resistance with the application of a small magnetic field as mentioned above, while the magneto-resistive element of a semiconductor or magnetic material shows resistance variation extending along a quadratic curve. The reason why the superconductor shows such a radical resistance variation is because the superconducting state is collapsed beginning from the grain boundaries in the superconductor by the application of a weak magnetic field as described above, so that the superconductor abruptly has the electrical resistive property.

Figure 1:
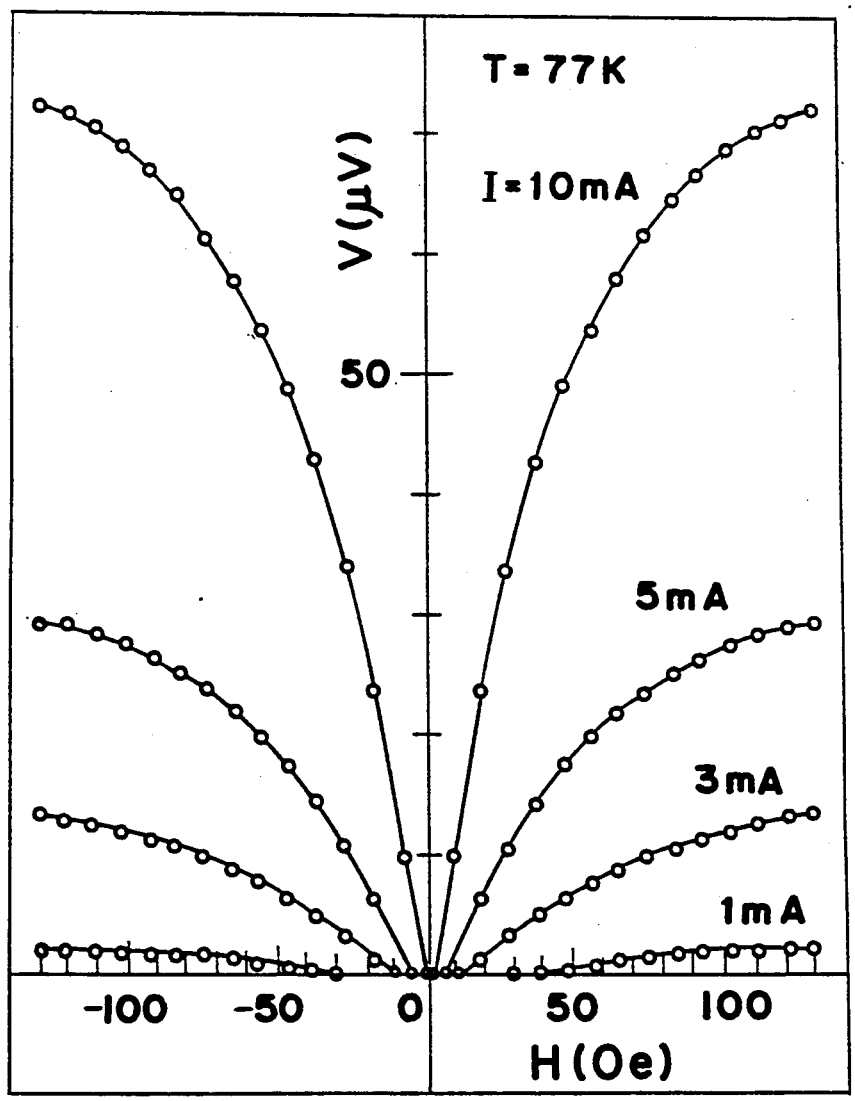
FIG. 1 is a graph for showing the characteristics of the superconductive magneto-resistive element embodying the present invention.

Owing to this magneto-resistive effect, by increasing current fed to the superconductor 1 as shown in FIG. 3, the strength of a magnetic field for inducing the voltage across the superconductor, can be decreased as shown in FIG. 1. As apparent from FIG. 1, when a current of 1 mA is fed to the superconductor 1, voltage is induced by the application of a magnetic field of 25 oersted (hereinafter referred to as Oe); when a current of 5 mA is fed thereto, voltage is induced by the application of a magnetic field of 7.5 Oe; and when a current of 10 mA is fed thereto, voltage is induced by the application of a magnetic field of 3 Oe.

FIG. 2 shows the magnetic field measurement according to the present invention which utilizes the above mentioned magneto-resistive effect of a superconductor. On a condition that no magnetic field is applied to the superconductor 1, in a direction perpendicular to the surface 1a of the superconductor 1 by means of a magnetic source 20. It is noted that the magnetic field in any direction can be applied to the superconductor 1. In order to generate a voltage at the point A (0.5 $\mu$V), a current of 21 mA is fed thereto through the current electrodes 9 $\mu$. When a magnetic field is applied to the superconductor under the condition, the resistance of the superconductor is increased, thereby increasing output voltage of the superconductor 1. For this reason, the current is decreased to lower the output voltage to a predetermined value. When a magnetic field of 8 Oe is applied to the superconductor 1, the current is decreased to 5 mA so as to shift the voltage value to the B. When a magnetic field of 29 Oe is applied to the superconductor 1, the current is decreased to 1 mA so as to shift the voltage value to the C. In this connection, at the points B and C, the output voltage is specified to 0.5 $\mu$V.

As shown in FIG. 2, by preparing the relational characteristic graph or data of the current fed thereto, an applied magnetic field strength, and output voltage of the respective ceramic superconductive magneto-resistive element, an applied magnetic field strength can be calculated based on the current value corresponding to the predetermined output voltage.

Figure 4:
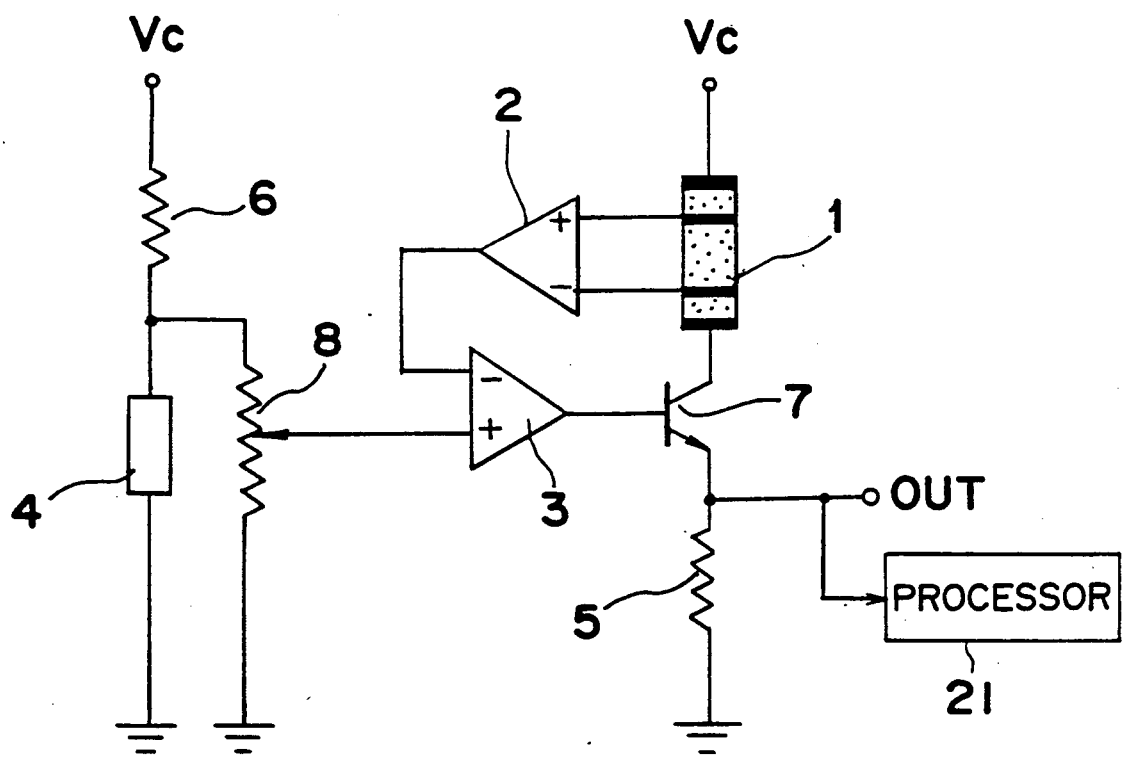
FIG. 4 is a diagram for illustrating the construction of one embodiment of the apparatus according to the present invention.

FIG. 4 is a circuit diagram for effecting the magnetic field measuring operations by the ceramic superconductive magneto-resistive element according to the present invention.

An output voltage setting circuit is shown in the left side of FIG. 4. Referring to FIG. 4, a constant voltage circuit 4 made of an integrated circuit (IC) and a semi-variable resistor 8 for voltage division are connected in parallel and are connected to a power source Vc through a resistor 6. Output voltage is set by adjusting the semi-variable resistor 8. In the right side of FIG. 4, a magneto-resistive element composed of a superconductor 1, a transistor 7, and an output resistor 5 are serially connected to the power source Vc. In this circuit connection, the output voltage from the voltage electrodes 10 of the magneto-resistive element is inputted to a differential amplifier 2, the output terminal of which is connected to the negative input terminal of an operational amplifier 3, and the output of the above mentioned output voltage setting circuit is connected to the positive terminal of the operational amplifier 3. An output of the operational amplifier 3 is connected to the base of the transistor 7. The operational amplifier 3 compares the predetermined voltage value of the positive input terminal with the output voltage of the magneto-resistive element of the negative input terminal, and inputs, to the transistor 7, a signal indicating the difference therebetween, and the transistor 7 controls the current flowing the magneto-resistive element 1 so as to make the voltage of the positive input terminal of the amplifier 3 and that of the negative input equal.

By the above mentioned circuit operation, the stabilized current value is fetched as voltage through the resistor 5. This is adopted to the embodiment as described in connection with FIG. 2. When the resistor 5 is set to 100 Ω, and the predetermined voltage to 0.5 μv, currents of 21 mA, 5 mA, and 1 mA flow respectively corresponding to the respective magnetic fields of 0 Oe, 8 Oe, and 29 Oe, and hence, voltages of 2.1 V, 0.5 V, and 0.1 V are generated in the output voltage terminal OUT through the resistor 5. The voltage on the terminal OUT is applied to a data processor 21 in which calculation to convert the current value into the strength of the magnetic field is performed.

The foregoing description is made with respect to the magnetic measuring operation according to the present invention, the measuring precision is, however, improved by employing a superconductive magneto-resistive element which is the most suitable for an applied magnetic field strength by selecting from the magneto-resistive elements of different sensitivity.

The ceramic superconductive magneto-resistive elements have different sensitivities to accomplish the above mentioned object. Superconductors employed for the ceramic superconductive magneto-resistive devices can have different sensitivities by varying the production conditions.

For example, a ceramic superconductor is produced by calcining the before mentioned powder materials. When the pressing force is only changed from 1 ton/cm$^2$ to 0.5 ton/cm$^2$, the packing density is reduced to 90% or less of that produced under a pressure of 1 ton/cm$^2$, the surface roughness is increased to 1 μm or more, and the sensitivity as the magneto-resistive element is, however, improved. Furthermore, the semiconductor sensitivity is improved by decreasing the packing density of the superconductor to make a porous one, by forming fine pores on the superconductor surface with a laser or the like, or by varying the junction conditions in the grain boundaries of the superconductor through a thermal or mechanical process. The sensitivity characteristics of the magnetic resistive device obtained through the above mentioned process have reproducibility, are not varied with time, and can be kept stably to a predetermined value.

Figure 5:
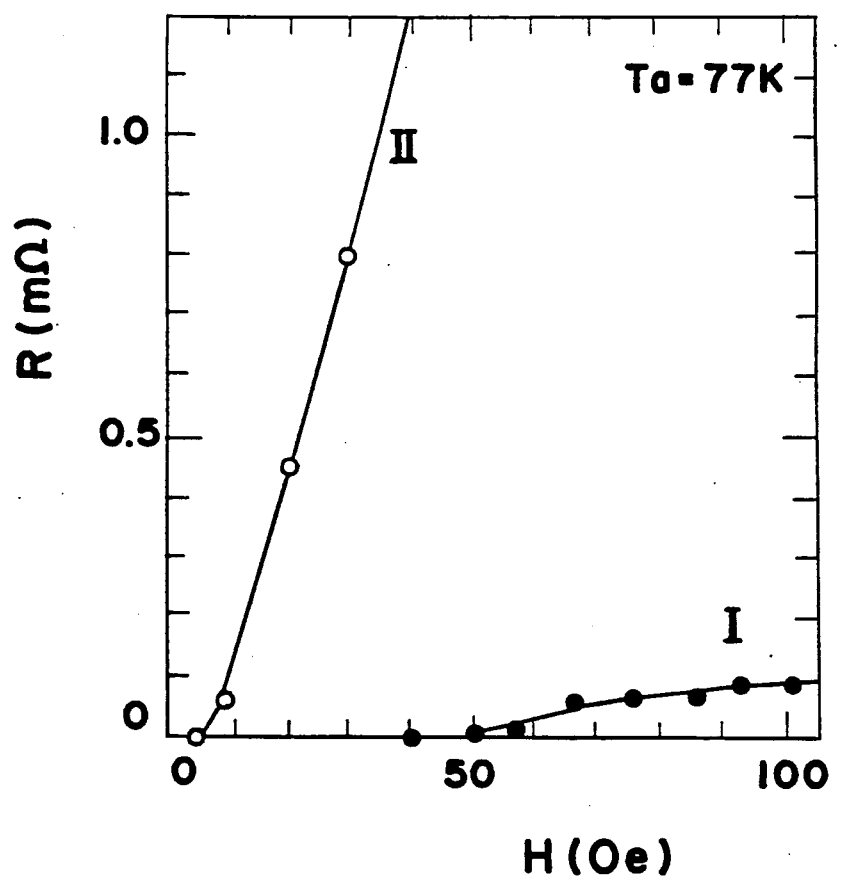
FIG. 5 shows the manufacturing method of the magneto-resistive element, or the difference in characteristics between the devices different in shape.

FIG. 5 is the modification of the before described embodiment, in which a superconductor is varied in thickness to change the sensitivity of the magneto-resistive element. In this embodiment, the ceramic superconductor is formed in a rectangular chip of 1 mm wide × 7 mm long, and the graph I represents the original thickness 1 mm thereof when cut, and the graph II represents the thickness 0.6 mm after mechanical abrasion. Currents fed to them are 1 mA.

As understood from the above mentioned descriptions, the sensitivity of the magneto-resistive element is varied depending on the production conditions of the superconductor, and current fed to the device can be arbitrarily controlled in accordance with the size, shape or other design of the device. Therefore, there can be manufactured a desirable magneto-resistive element being capable of matching with the measuring conditions such as an applied magnetic field strength, magnetic and spatial resolving powers or the like as required, so that a precise magnetism measurement can be effected.

When a magneto-resistive element is selected from those having various characteristics for use, or when the predetermined voltage value of the measuring circuit is varied, an apparatus for generating a predetermined magnetic field is provided for quickly preparing the calibrating data therefor, so that calibrating operation taken into account the conditions of the magnetic resistive device and the driving circuit therein can be readily carried out. Accordingly, a magnetic field strength can be calculated precisely under the most suitable conditions.

According to the present invention, the ceramic superconductive magneto-resistive element which has a high sensitivity to a weak magnetic field because of the weak grain boundary junction is used for measuring the magnetic field adopting such properties that the current is remarkably changed against variation in a magnetic field strength. In other words, the superconductive magneto-resistive element can measure the magnetic field under such a condition of the element that the current value with a small electric resistance, whereby the current fed thereto can be controlled with a high accuracy. Therefore, by measuring this controlled current, a magnetic field strength can be measured in the most operative conditions of the ceramic superconductive magneto-resistive element.

What is claimed is:

1. An apparatus for measuring magnetic field using a magneto-resistive element comprising:
    a superconductive magneto-resistive element which changes electric resistance in response to the magnetic field coupled to a reference current source of a first voltage;
    at least one pair of current electrodes provided on a surface of said element for supplying current said at least one pair of current electrodes including a first and second electrode;
    at least one pair of voltage electrodes provided on said element for deriving a voltage generated on the surface of the element said at least one pair of voltage electrodes including a first and second voltage electrode;
    means for setting a second reference voltage operatively connected to said reference current source;
    means for comparing the output voltage, of the element with the second voltage, the output voltage of the element being output from the second voltage electrode and the first voltage output from the first voltage electrode; and control means for controlling current to equalize the output voltage of the element when there is a difference between the output and second voltages so that the strength of the magnetic field can be measured dependent on a current value when both the output and reference voltages are equal.

2. The apparatus as claimed in claim 1, comprising a plurality of said superconductive magneto-resistive elements each of which is different in sensitivity with respect to the strength of an applied magnetic field for selectively used corresponding to the strength of said applied magnetic field.

3. The apparatus as claimed in claim 1, wherein said apparatus further comprises means for applying a predetermined constant magnetic field to said superconductive magneto-resistive element for calibrating the apparatus based on variation in the value of current flowing between the current electrodes.

4. An apparatus that can measure a magnetic field comprising:

a superconductive magneto-resistive element formed of a ceramic superconductive material that has weakly joined grain boundaries, which changes electrical resistance in response to the application of the magnetic field coupled to a reference current source of a first voltage;

at least one pair of current electrodes on a surface of said element for supplying current said at least one pair of current electrodes including a first and second electrode;

means for setting a second voltage operatively connected to said reference current source;

means for comparing the output voltage, of the element with the second voltage, the output voltage of the element being output from the second voltage electrode and the first voltage output from the first voltage electrode; and control means for controlling current to equalize the output voltage of the element when there is a difference between the output and the second voltages so that the strength of the magnetic field can be measured dependent on a current value when both the output and second voltages are equal.

* * * * *